(12) United States Patent
Nakayama

(10) Patent No.: US 11,874,319 B2
(45) Date of Patent: Jan. 16, 2024

(54) INSPECTION APPARATUS AND CONTROL METHOD FOR INSPECTION APPARATUS

(71) Applicant: TOKYO ELECTRON LIMITED, Tokyo (JP)

(72) Inventor: Hiroyuki Nakayama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/376,751

(22) Filed: Jul. 15, 2021

(65) Prior Publication Data

US 2022/0018889 A1 Jan. 20, 2022

(30) Foreign Application Priority Data

Jul. 16, 2020 (JP) .................................. 2020-122153

(51) Int. Cl.
*G01R 31/26* (2020.01)
*G01R 1/073* (2006.01)

(52) U.S. Cl.
CPC ..... *G01R 31/2642* (2013.01); *G01R 1/07342* (2013.01)

(58) Field of Classification Search
CPC ............ G01R 31/2642; G01R 1/07342; G01R 31/2875; G01R 31/2891; G01R 1/07314; G01R 31/2863; H01L 21/67242; H01L 21/67253; H01L 22/20; H05B 3/0033
See application file for complete search history.

(56) References Cited

U.S. PATENT DOCUMENTS 11,125,813 B2  9/2021  Kasai
2021/0033666 A1  2/2021  Kasai

FOREIGN PATENT DOCUMENTS

| EP | 3550313 A1 | 10/2019 | |
|---|---|---|---|
| JP | 2019-102645 A | 6/2019 | |
| JP | 2019-153717 A | 9/2019 | |
| WO | WO 2019/107079 A1 | 6/2019 | |
| WO | WO-2019107079 A1 * | 6/2019 | ............ G01R 31/26 |

OTHER PUBLICATIONS

English machine translation of WO 2019/107079 (Year: 2019).*

* cited by examiner

*Primary Examiner* — Lee E Rodak
(74) *Attorney, Agent, or Firm* — Fenwick & West LLP

(57) ABSTRACT

An inspection apparatus includes a stage on which a substrate having an inspection target is placed, a probe card, a light irradiator, and a controller. The probe card has probes that supply a current to the inspection target. The light irradiator irradiates light to heat the substrate. The controller controls the light irradiator to execute uniformly heating the inspection target by the light from the light irradiator, and heating an outer peripheral portion of the inspection target by the light from the light irradiator.

11 Claims, 7 Drawing Sheets

INSPECTION APPARATUS AND CONTROL METHOD FOR INSPECTION APPARATUS

CROSS-REFERENCE TO RELATED APPLICATIONS

This application claims priority to Japanese Patent Application No. 2020-122153, filed on Jul. 16, 2020, the entire contents of which are incorporated herein by reference.

TECHNICAL FIELD

The present disclosure relates to an inspection apparatus and a control method for the inspection apparatus.

BACKGROUND

Some inspection apparatuses have a wafer or a carrier having electronic devices placed on a substrate support and electrical characteristics of the electronic devices are inspected by supplying a current from a tester to the electronic devices through probes or the like. Temperatures of the electronic devices are controlled by a cooling mechanism or a heating mechanism in the substrate support.

Japanese Patent Application Publication No. 2019-153717 discloses a testing device for inspecting an electronic device by causing contact terminals to electrically contact the electronic device, includes, a mounting table formed with a light transmission member opposite the side on which a inspection object is placed and having therein a coolant flow path through which a coolant capable of transmitting light flows, a light irradiator disposed so as to face the surface opposite the inspection object placement side of the mounting table, and having LEDs pointing toward the inspection object, and a controller controlling absorption of heat by the coolant and heating by the lights from the LEDs to control the temperature of the electronic device to be inspected. The controller controls the light output from the LEDs based on the measured temperature of the electronic device to be inspected and controls the absorption of heat by the coolant based on the LED light output.

When the electronic device is inspected, the electronic device generates heat due to a current supplied to the electronic device. The electronic device has heat distribution in which the temperature is high on a central side and low on an outer peripheral side due to heat dissipation toward an outer periphery of the electronic device.

SUMMARY

In one aspect, the present disclosure provides an inspection apparatus for improving temperature uniformity of an inspection target, and a control method for the inspection apparatus.

In accordance with an aspect of the present disclosure, there is provided an inspection apparatus. The inspection apparatus comprises a stage on which a substrate having an inspection target is placed, a probe card having probes that supply a current to the inspection target, a light irradiator configured to irradiate light to heat the substrate, and a controller configured to control the light irradiator. The controller is configured to have the light irradiator to execute a step of uniformly heating the inspection target by the light from the light irradiator; and a step of heating an outer peripheral portion of the inspection target by the light from the light irradiator.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
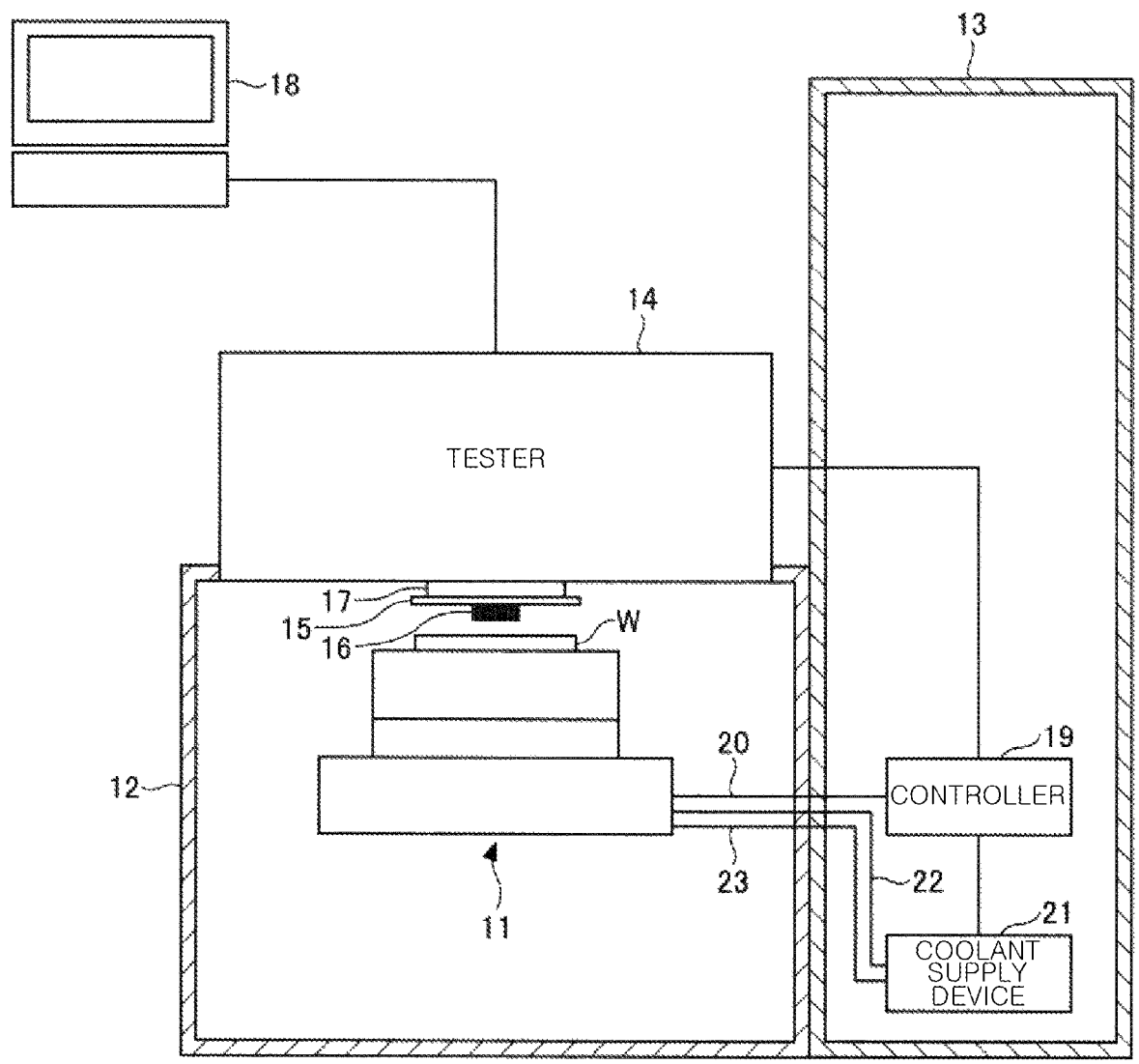
FIG. 1 is a schematic cross-sectional view illustrating a configuration of an inspection apparatus according to an embodiment.

Hereinafter, embodiments of the present disclosure will be described in detail with reference to the accompanying drawings. Like reference numerals will be given to like parts throughout the drawings, and redundant description thereof may be omitted.

<Inspection Apparatus>

An inspection apparatus 10 including a stage (substrate support) 11 according to an embodiment will be described with reference to FIG. 1. FIG. 1 is an example of a schematic cross-sectional view illustrating a configuration of the inspection apparatus 10 according to the embodiment.

The inspection apparatus 10 is configured to respectively inspect electrical characteristics of a plurality of electronic devices (inspection targets) disposed on a wafer (substrate) W. The substrate having the inspection target is not limited to the wafer W, and includes a carrier, a glass substrate, a single chip or the like having electronic devices thereon. The inspection apparatus 10 includes an accommodating chamber 12 accommodating a stage 11 on which the wafer W is placed, a loader 13 disposed adjacent to the accommodating chamber 12, and a tester 14 disposed to cover the accommodating chamber 12.

The accommodation chamber 12 has a hollow housing shape. In the accommodating chamber 12, the stage 11 on which the wafer W is placed and a probe card 15 disposed to face the stage 11 are accommodated. The probe card 15 has a plurality of needle-shaped probes (contact terminals) 16 arranged to correspond to solder bumps or electrode pads installed correspondingly to electrodes of each electronic device of the wafer W.

The stage 11 has a fixing mechanism (not shown) for fixing the wafer W to the stage 11. Accordingly, the displacement of the position of the wafer W with respect to the stage 11 is prevented. Further, a moving mechanism (not shown) for moving the stage 11 in a horizontal direction and a vertical direction is disposed in the accommodating chamber 12. Accordingly, the solder bumps or the electrodes pads installed correspondingly to electrodes of each electronic device are brought into contact with the probes 16 of the probe card 15 by adjusting a relative position between the probe card 15 and the wafer W.

The loader 13 is configured to extract a wafer W having the electronic devices thereon from a FOUP (not shown) that is a transfer container and places the wafer W on the stage 11 in the accommodating chamber 12. Further, the loader 13 is configured to remove an inspected wafer W from the stage 11 and accommodates the inspected wafer W in the FOUP.

The probe card 15 is connected to the tester 14 through an interface 17. When the probes 16 are brought into contact with the solder bumps or the electrode pads installed correspondingly to the electrodes of each electronic device of the wafer W, the probes 16 supply electric power from the tester 14 to the electronic device through the interface 17 or transmits signals from the electronic device to the tester 14 through the interface 17.

The tester 14 includes a test board (not shown) that emulates a part of a circuit configuration of a motherboard on which the electronic devices are installed. The test board is connected to a tester computer 18 that is configured to determine whether the electronic devices are defective or non-defective based on the signals from the electronic devices. In the tester 14, it is possible to emulate the circuit configurations of various types a. van der bellen of motherboards by replacing the test board.

A controller 19 controls an operation of the stage 11. The controller 19 controls the moving mechanism (not shown) of the stage 11 to move the stage 11 in the horizontal direction and the vertical direction. Further, the controller 19 is connected to the stage 11 through a wiring 20. The controller 19 controls an operation of the light irradiator 40 to be described later through the wiring 20. Further, the controller 19 is connected to the tester 14 to communicate with the tester 14, and the information of the tester 14 is inputted to the controller 19.

A coolant supply device 21 is connected to a coolant channel 31 of the stage 11 through a supply pipe 22 and a return pipe 23, and the coolant can be circulated between the coolant supply device 21 and the coolant channel 31 of the stage 11. The controller 19 controls the coolant supply device 21 to control a temperature, a flow rate, or the like of the coolant that is supplied from the coolant supply device 21 to the coolant channel 31.

Although it is illustrated in FIG. 1 that the controller 19 and the coolant supply device 21 are disposed in the loader 13, the present disclosure is not limited thereto and the controller 19 and the coolant supply device 21 may be disposed at other positions.

In the inspection apparatus 10, when the electrical characteristics of the electronic devices are inspected, the tester computer 18 transmits data to the test board connected thereto through the electronic devices and the probes 16. Then, the tester computer 18 determines whether or not the transmitted data has been correctly processed by the test board based on the electrical signals from the test board.

Figure 2:
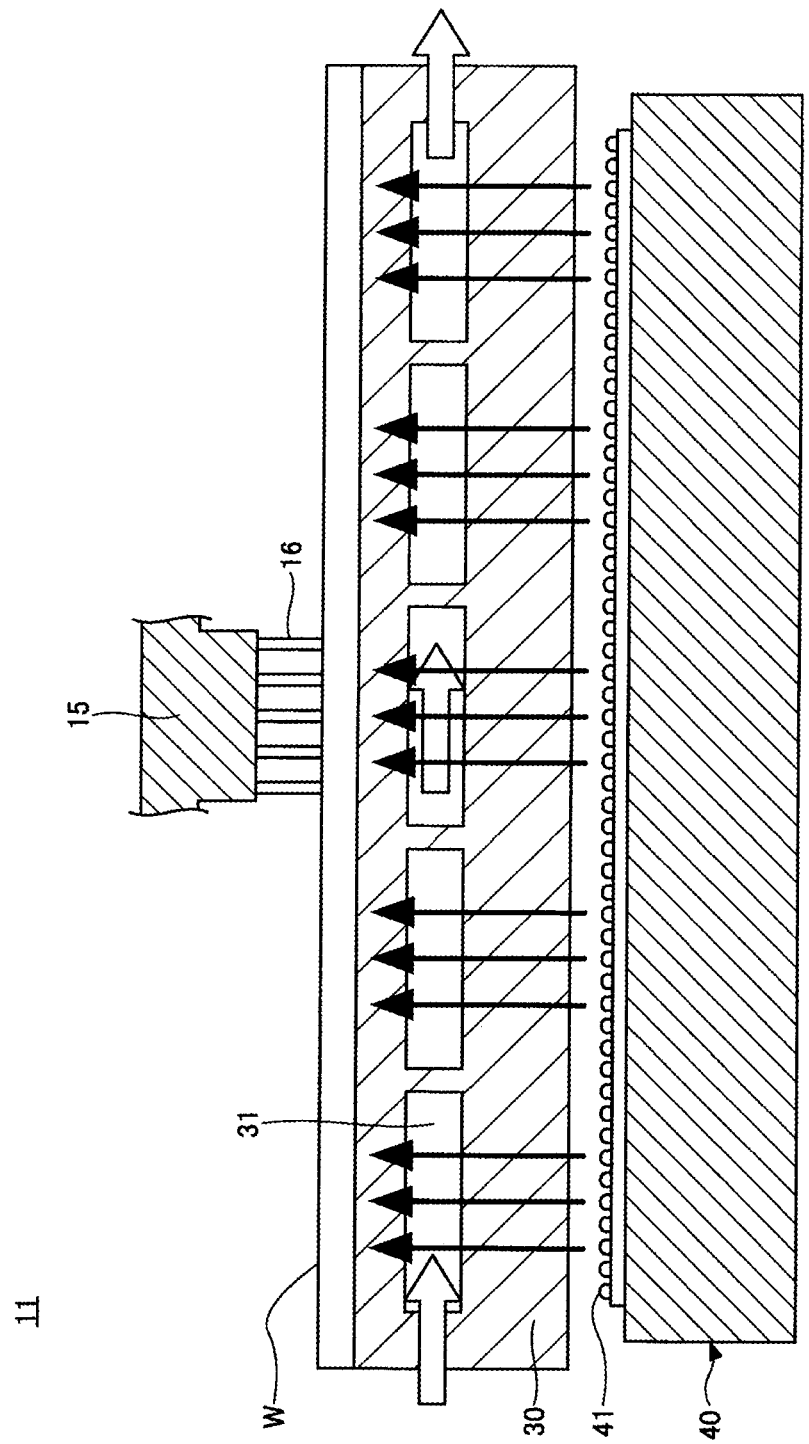
FIG. 2 is an example of a schematic cross-sectional view illustrating a wafer temperature control mechanism in the inspection apparatus according to the embodiment.

Next, a temperature adjusting mechanism of the wafer W in the inspection apparatus 10 according to the embodiment will be described with reference to FIG. 2. FIG. 2 is an example of a schematic cross-sectional view illustrating the temperature adjusting mechanism of the wafer W in the inspection apparatus 10 according to the embodiment. In FIG. 2, the flow of the coolant is indicated by white arrows. Further, in FIG. 2 (and FIGS. 4 and 6 to be described later), the light emitted from the light irradiator 40 is indicated by solid arrows.

The stage 11 has a supporting unit 30 and the light irradiator 40.

The wafer W on which the electronic devices are formed is placed on the supporting unit 30. The supporting unit 30 is formed of a transparent member that transmits light irradiated from the light irradiator 40. Accordingly, the light irradiated from the light irradiator 40 passes through the supporting unit 30 and is irradiated to the backside of the wafer W. Further, a coolant channel (cooling unit) 31 is formed in the stage 11. The coolant is supplied to the coolant channel 31 from the coolant supply device 21 (see FIG. 1) through the supply pipe 22 (see FIG. 1). The coolant flowing through the coolant channel 31 is returned to the coolant supply device 21 through the return pipe 23 (see FIG. 1). The coolant may be, for example, Galden (Registered Trademark) or colorless liquid that allows light to pass therethrough such as water.

The light irradiator 40 includes a plurality of LEDs 41 for irradiating light. An assembly of the LEDs 41 is divided into predetermined regions (see FIGS. 5 and 7 to be described later) in plan view. The controller 19 can control the on/off and the light amount of the LEDs 41 for each divided region. Although the light irradiator 40 using the LEDs 41 as a light source will be described, the type of the light source is not limited to thereto.

The light emitted from the light irradiator 40 transmits the supporting unit 30 formed of the transparent material and the coolant flowing through the coolant channel 31, and is irradiated to the bottom surface of the wafer W. Accordingly, the temperature of the wafer W irradiated with light is increased, and the temperatures of the electronic devices are increased. Further, the light absorbing member may be disposed on the upper surface of the supporting unit 30 (the surface on which the wafer W is placed). In this configuration, the light emitted from the light irradiator 40 is irradiated to the light absorbing member, and the temperature of the light absorbing member is increased. Then, the heat is transferred from the light absorbing member to the wafer W, so that the temperatures of the electronic devices formed on the wafer W are increased. Further, the light irradiator 40 can control the region of the wafer W whose temperature is to be increased by the light irradiator 40 by controlling which partitioned LEDs 41 are to be turned on.

The probes 16 are brought into contact with the electrodes of the electronic device. The tester 14 (see FIG. 1) can allow a current to flow through a circuit in the electronic device by applying a voltage to the electrodes of the electronic device through the probes 16.

Figure 3:
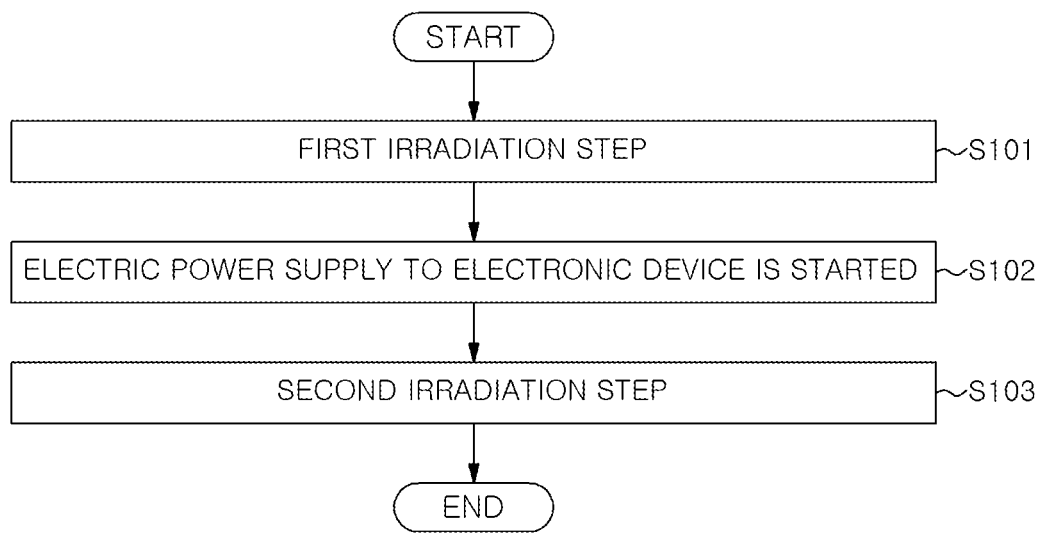
FIG. 3 is an example of a flowchart illustrating temperature control of a wafer placed on a stage in the inspection apparatus according to the embodiment.

FIG. 3 is an example of a flowchart illustrating temperature control of the wafer W placed on the stage 11 in the inspection apparatus 10 according to the embodiment.

In step S101, the controller 19 performs a first irradiation step. The first irradiation step is performed before the inspection of an electronic device 500 is started, i.e., before a current is supplied to the electronic device 500 through the probes 16.

Figure 4:
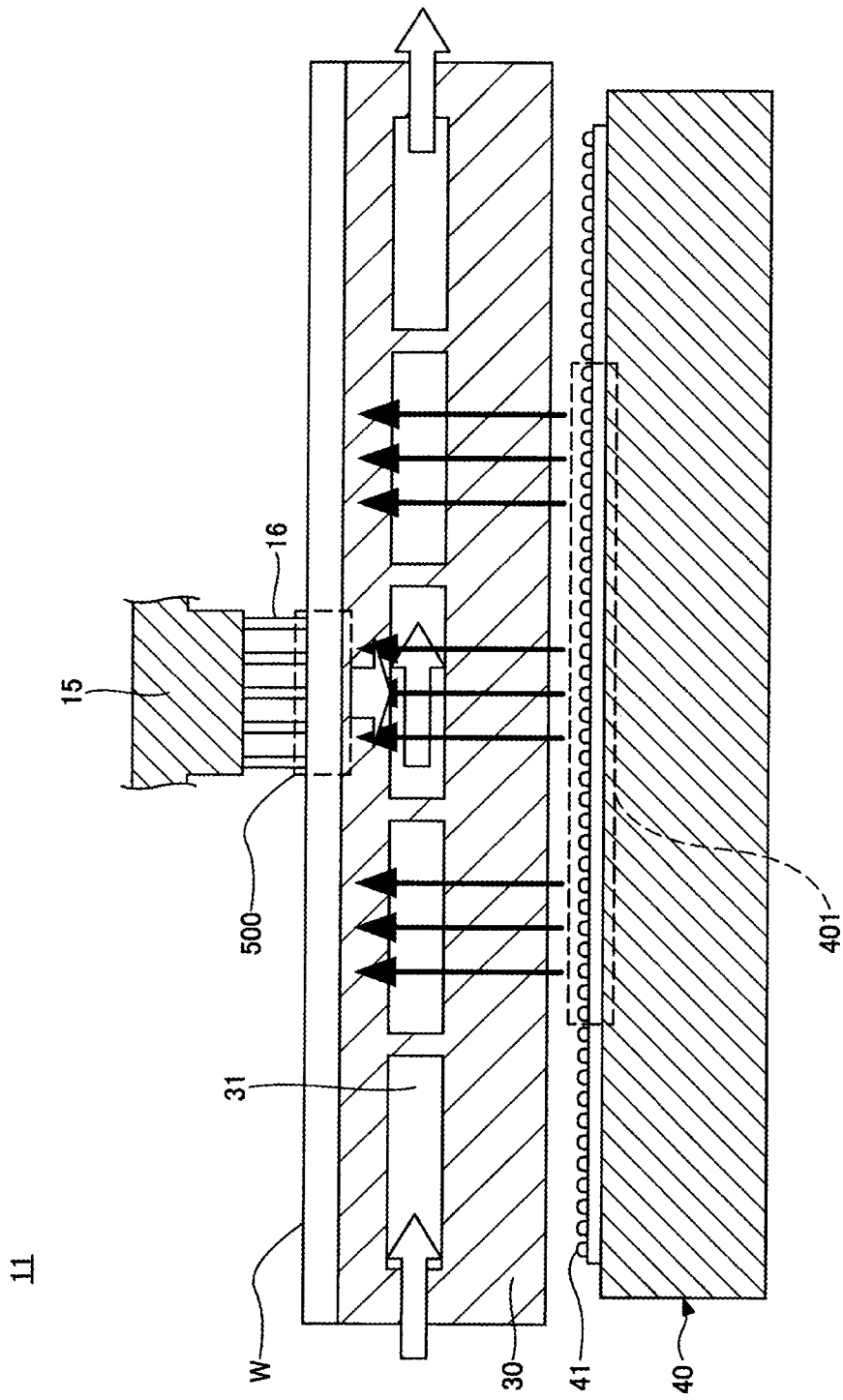
FIG. 4 is an example of a schematic cross-sectional view illustrating an operation of the temperature control mechanism in a first irradiation step.
Figure 5:
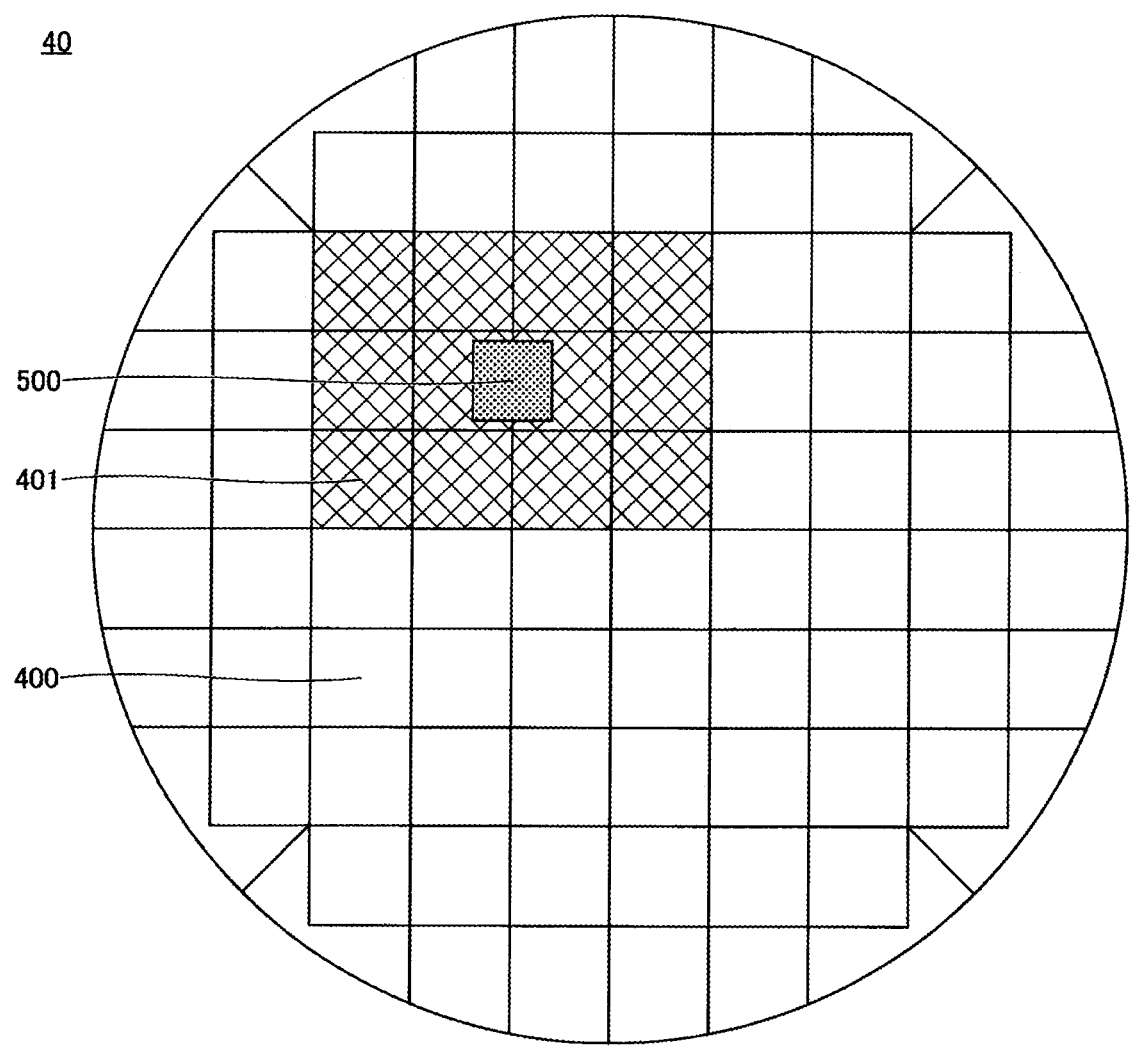
FIG. 5 is an example of a plan view illustrating an example of partitioned LEDs for irradiating light in the first irradiation step.

In this specification, the first irradiation step will be further described with reference to FIGS. 4 and 5. FIG. 4 is an example of a schematic cross-sectional view illustrating an operation of the temperature adjusting mechanism in the first irradiation step. FIG. 5 is an example of a plan view illustrating an example of dividing the LEDs for irradiating light in the first irradiation step. Further, in FIG. 4 (and FIG. 6 to be described later), the position of the electronic device 500 as an inspection target is indicated by a broken line. Further, in FIG. 5 (and FIG. 7 to be described later), the position of the electronic device 500 as an inspection target in plan view is indicated by hatching dots. The electronic device 500 as an inspection target may be a single chip or may be multiple chips being inspected simultaneously.

As shown in FIG. 5, the light irradiator 40 is partitioned into multiple LED arrays 400. Each LED array 400 is provided with a plurality of LEDs 41 (see FIG. 4). The controller 19 can control the on/off and the light amount of the LEDs 41 for each LED array 400.

In the first irradiation step, the controller 19 turns on the LED arrays 400 in the region 401 including the position of the electronic device 500 as an inspection target, and uniformly irradiates light to the electronic device 500 as an inspection target. In FIG. 5, the region 401 of the LED arrays 400 which are turned on to irradiate light is indicated by hatching. Further, in FIG. 4, the light irradiated from the light irradiator 40 is indicated by the solid arrows.

Accordingly, the electronic device 500 as an inspection target is uniformly heated by the light irradiator 40. Further, the coolant circulates through the coolant channel 31 of the supporting unit 30. Further, as indicated by the white arrows, the heat of the electronic device 500 is uniformly absorbed from the electronic device 500 to the supporting unit 30. Accordingly, the in-plane uniformity of the temperature of the electronic device 500 as an inspection target can be ensured. Further, the controller 19 may perform feedback control of the light amount of each LED array 400 based on detection values of a plurality of temperature sensors (not shown) disposed at the stage 11.

In step S102, the tester 14 allows a current to flow through the electronic device 500 through the probes 16 to start the inspection of the electronic device 500. In this specification, when the heat generation of the electronic device 500 is detected, the controller 19 switches the control of the light irradiator 40 from the first irradiation step shown in step S101 to a second irradiation step shown in step S103.

In this specification, the controller 19 detects heat generation of the electronic device 500 based on an internal variable that controls the light irradiator 40. For example, the controller 19 performs feedback control of the light amount of each LED array 400 based on the detection values of the temperature sensors (not shown) disposed at the stage 11. The controller 19 detects heat generation of the electronic device 500 based on the feedback amount (internal variable).

Further, the controller 19 acquires from the tester 14 a signal (trigger signal) indicating that the inspection of the electronic device 500 has started. In other words, the controller 19 acquires from the tester 14 the signal indicating that the electric power supply from the tester 14 to the electronic device 500 has started. The controller 19 may be configured to detect heat generation of the electronic device 500 based on the acquired signal.

Further, the controller 19 acquires from the tester 14 information (power information) of the electric power supplied from the tester 14 to the electronic device 500. The controller 19 may be configured to detect heat generation of the electronic device 500 based on the acquired information.

In step S103, the controller 19 performs the second irradiation step. The second irradiation step is performed when the electronic device 500 is inspected, i.e., in a state where the current is supplied to the electronic device 500 through the probes 16.

Figure 6:
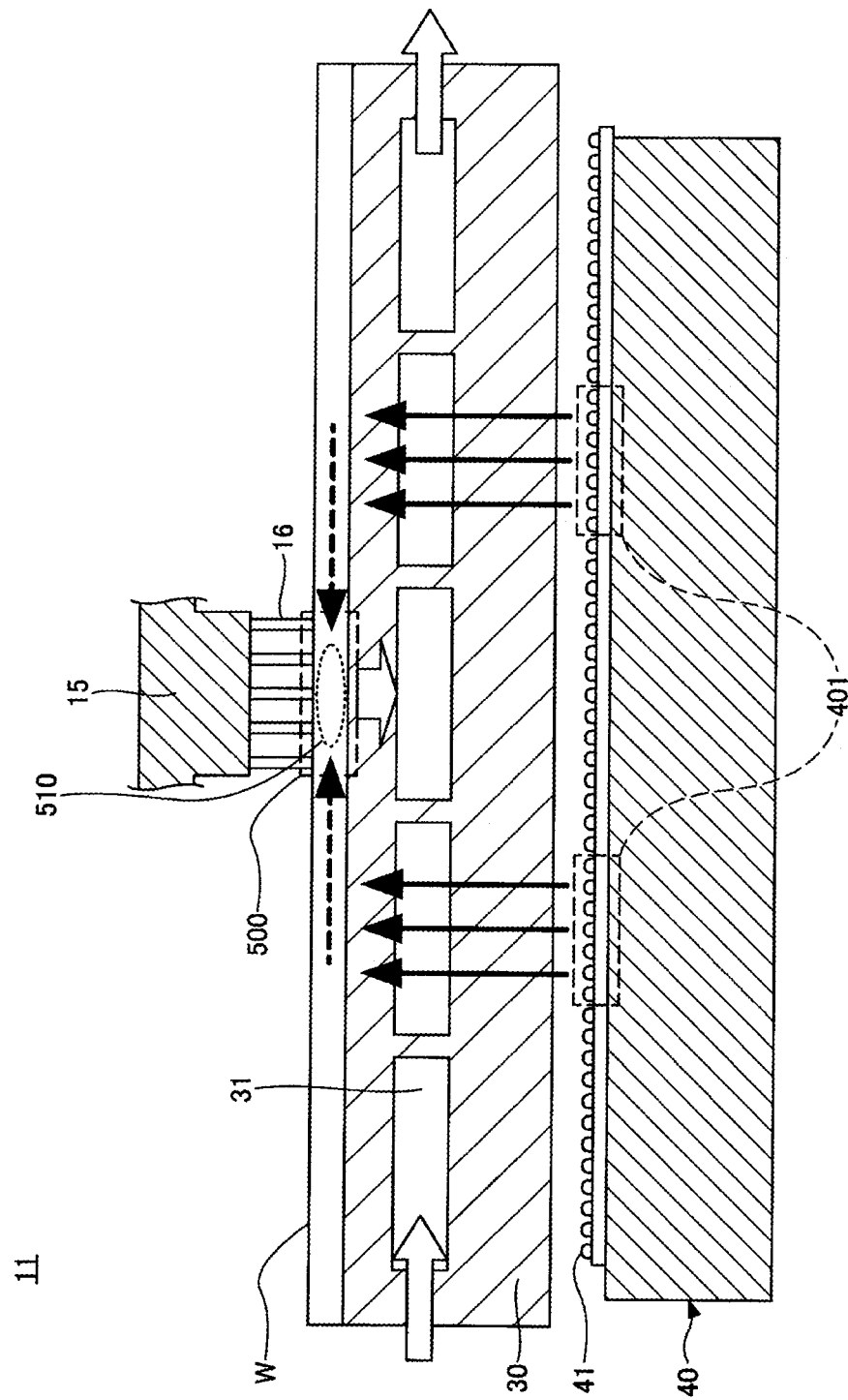
FIG. 6 is an example of a schematic cross-sectional view illustrating an operation of the temperature control mechanism in a second irradiation step.
Figure 7:
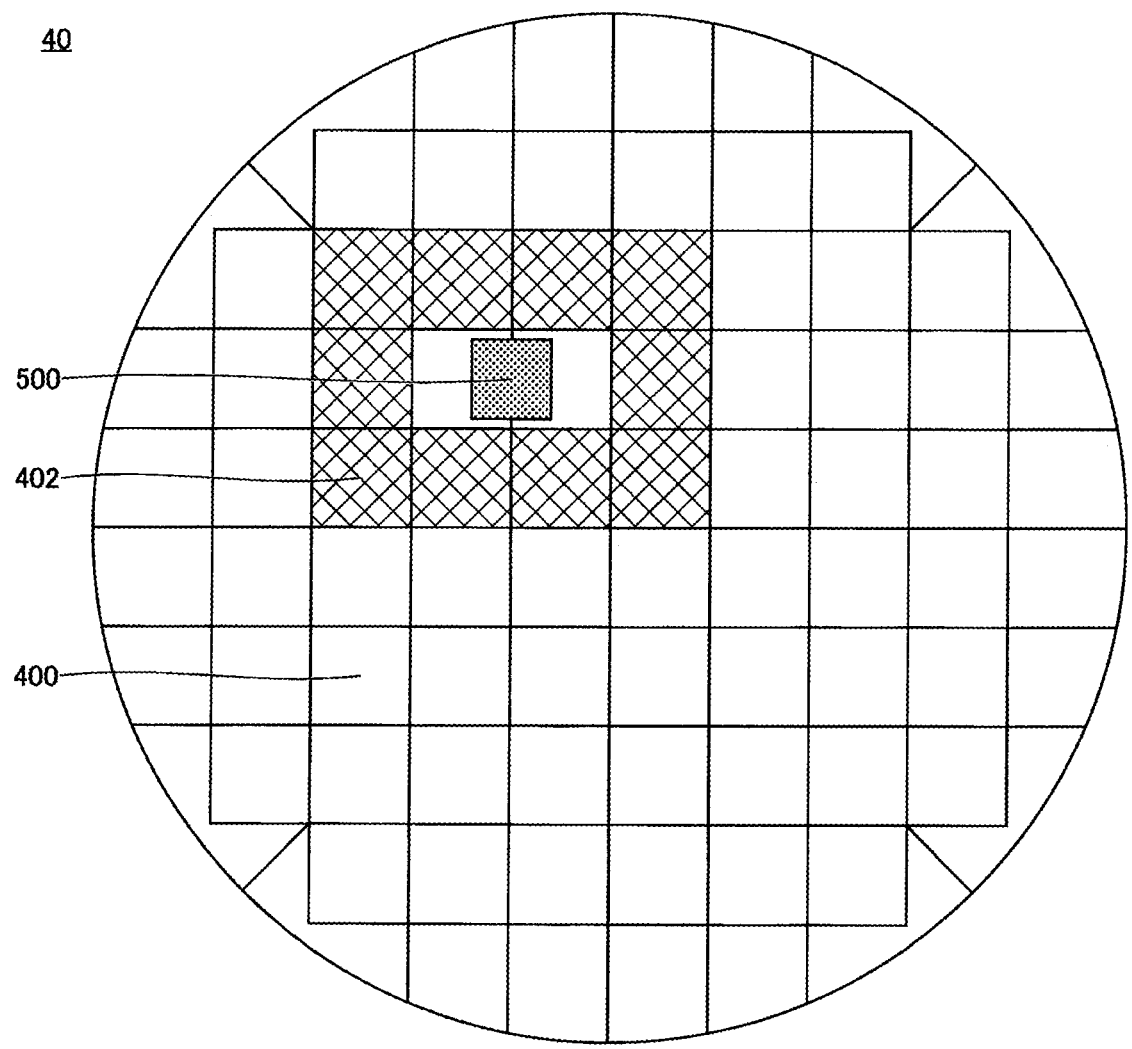
FIG. 7 is an example of a plan view illustrating an example of dividing the LEDs for irradiating light in the second irradiation step.

In this specification, the second irradiation step will be further described with reference to FIGS. 6 and 7. FIG. 6 is an example of a schematic cross-sectional view illustrating the operation of the temperature adjusting mechanism in the second irradiation step. FIG. 7 is an example of a plan view illustrating an example of partitioned LED arrays 400 for irradiating the light in the second irradiation step.

As shown in FIGS. 6 and 7, in the second irradiation step, the controller 19 turns on the LED arrays 400 in a region 402 (hatched frame portion) to irradiate light to the outer peripheral portion of the electronic device 500 as an inspection target, and irradiates the light to the outer peripheral portion of the electronic device 500 as an inspection target. Here, the outer peripheral portion of the electronic device 500 means a portion at the vicinity of the periphery which includes both inside and outside the periphery of the electronic device 500. In FIG. 7, the region 402 of the LED arrays 400 which is turned on to irradiate light is indicated by hatching. Further, in FIG. 6, the light irradiated from the light irradiator 40 is indicated by solid arrows.

In this specification, the electronic device 500 as an inspection target generates heat by the current supplied from the tester 14 through the probes 16. The heat of the electronic device 500 is transferred (dissipated) to the neighboring region at the outer peripheral portion of the electronic device 500. Meanwhile, a heat storage portion 510 (see FIG. 6) is formed at a central portion of the electronic device 500.

In the second irradiation step, the light is irradiated to the outer peripheral portion of the electronic device 500 as an inspection target. Further, the temperature of the outer peripheral portion of the electronic device 500 may be increased by irradiating the light of the light irradiator 40 to the outer peripheral portion of (but within) the electronic device 500. Alternatively, the temperature of the outer peripheral portion of the electronic device 500 may be increased by transferring heat (see dashed arrows in FIG. 6) to the outer peripheral portion of the electronic device 500 by irradiating the light of the light irradiator 40 to outside of the electronic device 500.

Accordingly, the electronic device 500 is uniformly heated by the heat generation of the electronic device 500 (heat storage at the central portion of the electronic device 500) and the heating due to the light irradiated from the light irradiator 40 (heating of the outer peripheral portion of the electronic device 500). Further, as indicated by the white arrows, the heat of the electronic device 500 is uniformly absorbed from the electronic device 500 to the supporting unit 30. Accordingly, the in-plane uniformity of the temperature of the electronic device 500 as an inspection target can be ensured.

In the flowchart shown in FIG. 3, the control of the light irradiator 40 is switched from the first irradiation step to the second irradiation step after the electric power supply to the electronic device 500 as an inspection target is started (after the heat generation of the electronic device 500 as an inspection target is detected). However, the present disclosure is not limited thereto. The control of the light irradiator 40 may be switched from the first irradiation step to the second irradiation step before the electric power supply to the electronic device 500 as an inspection target is started and, then (after the switching), the electric power supply to the electronic device 500 as an inspection target may be started. In other words, the order of step S102 and step S103 in FIG. 3 may be changed.

As described above, in the inspection apparatus 10 of the present embodiment, it is possible to improve the in-plane uniformity of the temperature of the electronic device as an inspection target. In other words, before the electronic device 500 generates heat, the LED array 400 in the region 401 including the position of the electronic device 500 as an inspection target is turned on and the light is uniformly irradiated to the electronic device 500 as an inspection target, so that the in-plane uniformity of the temperature of the electronic device 500 can be obtained. Further, during the heat generation of the electronic device 500, the LED arrays 400 in the region 402 is turned on to irradiate the light to the outer peripheral portion of the electronic device 500 as an inspection target, and the light is irradiated to the outer peripheral side of the electronic device 500 as an inspection target. Accordingly, the electronic device 500 as an inspection target is heated by the heat generation of the electronic device 500 and the heating due to the light irradiated from the light irradiator 40. Hence, the in-plane uniformity of the temperature of the electronic device 500 can be obtained.

Further, in the second irradiation step, since the LED 41 in the region 402 where the light is irradiated to the outer peripheral portion of the electronic device 500 as an inspection target can be turned on, and the LED 41 for irradiating the light to the central portion of the electronic device 500 as an inspection target can be turned off, it possible to reduce the power consumption of the light irradiator 40.

While the inspection apparatus 10 has been described above, the present disclosure is not limited to the above-described embodiments, and various changes and modifications can be made without departing from the scope of the appended claims and the gist thereof.

In the second irradiation step, the controller 19 turns off the LED arrays 400 located inside on the inner side than the frame-shaped region 402. In other words, the case where the LED arrays 400 for irradiating light to the central portion of the electronic device 500 is turned off is described. However, the present disclosure is not limited thereto. The controller 19 may control the light amount distribution of the light irradiator 40 such that the light amount of the LED arrays 400 for irradiating light to the central portion of the electronic device 500 as an inspection target becomes smaller than the light amount of the LED array 400 for irradiating light to the outer peripheral portion of the electronic device 500 as an inspection target.

Further, although the case where the inspection apparatus 10 switches from the first irradiation step (uniform irradiation) to the second irradiation step (peripheral irradiation) depending on whether or not the electronic device generates heat has been described, the control of the light irradiator 40 is not limited thereto. It is also possible to switch from the first irradiation step (uniform irradiation) to the second irradiation step (peripheral irradiation) depending on the heat emission amount of the electronic device. For example, when the heat emission amount of the electronic device is smaller than a predetermined threshold value, the first irradiation step (uniform irradiation) is performed. When the heat emission amount of the electronic device is greater than or equal to the predetermined threshold value, the second irradiation step (peripheral irradiation) is performed.

Further, in the inspection of the electronic device, the first irradiation step (uniform irradiation) and the second irradiation step (peripheral irradiation) may be repeated multiple times. Further, the region 402 may be changed depending on the inspection content.

Further, although the case where the light irradiator 40 is configured to irradiate light from the bottom surface of the wafer W has been described, the present invention is not limited thereto. The light irradiator 40 may be configured to irradiate light from the upper surface of the wafer W.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes to the embodiments described herein may be made without departing from the spirit of the disclosures. The accompanying claims and their equivalents are intended to cover such forms or modifications as would fall within the scope and spirit of the disclosures.

What is claimed is:

1. An inspection apparatus comprising:
    a stage on which a substrate having an inspection target is placed;
    a probe card having probes that supply a current to the inspection target;
    a light irradiator to irradiate light to heat the substrate, the light irradiator including a plurality of light sources partitioned into a plurality of regions; and
    a controller to control the light irradiator configured to execute:
        heating the inspection target by the light from the light irradiator before start of an inspection of the inspection target, and
        switching a control of the light irradiator from heating the inspection target to heating an outer peripheral portion of the inspection target by the light from the light irradiator based on a signal that indicates start of the inspection of the inspection target,
    wherein heating the inspection target includes irradiating light from both a light source in a region including a position of the inspection target, among the plurality of regions, and a light source in a region surrounding the region including the position of the inspection target, and
    wherein the heating the outer peripheral portion of the inspection target includes turning off the light source in the region including the position of the inspection target, thereby not irradiating light to the inspection target during the inspection of the inspection target.

2. The inspection apparatus of claim 1, wherein the heating of the inspection target is switched to the heating of the outer peripheral portion of the inspection target by the controller based on heat generation of the inspection target.

3. The inspection apparatus of claim 2, wherein
    the controller controls at least one of (i) on/off of the plurality of light sources for each partitioned region or (ii) a light amount of the plurality of light sources for each partitioned region.

4. The inspection apparatus of claim 1, wherein the heating of the inspection target is switched to the heating of the outer peripheral portion of the inspection target by the controller based on an internal variables for controlling the light irradiator.

5. The inspection apparatus of claim 4, wherein
    the controller controls at least one of (i) on/off of the plurality of light sources for each partitioned region or (ii) a light amount of the plurality of light sources for each partitioned region.

6. The inspection apparatus of claim 1, further comprising:
    a tester connected to the probe card to inspect the inspection target,
    wherein the heating of the inspection target is switched to the heating of the outer peripheral portion of the inspection target by the controller based on a signal from the tester that indicates start of the inspection of the inspection target.

7. The inspection apparatus of claim 6, wherein
the controller controls at least one of (i) on/off of the plurality of light sources for each partitioned region or (ii) a light amount of the plurality of light sources for each partitioned region.

8. The inspection apparatus of claim 1, further comprising:
a tester connected to the probe card to inspect the inspection target,
wherein the heating of the inspection target is switched to the heating of the outer peripheral portion of the inspection target by the controller based on current information supplied from the tester to the inspection target.

9. The inspection apparatus of claim 8, wherein
the controller controls the controller controls at least one of (i) on/off of the plurality of light sources for each partitioned region or (ii) a light amount of the plurality of light sources for each partitioned region.

10. The inspection apparatus of claim 1, wherein
the controller controls on/off and/or a light amount of the plurality of light sources for each partitioned region.

11. A control method of an inspection apparatus including a stage on which a substrate having an inspection target is placed, a probe card having probes that supply a current to the inspection target, a light irradiator to irradiate light to heat the substrate and the light irradiator including a plurality of light sources partitioned into a plurality of regions, and a controller to control the light irradiator, the control method, which is executed by the controller, comprising:
heating the inspection target by the light from the light irradiator before start of an inspection of the inspection target, and
switching a control of the light irradiator from the heating the inspection target to heating an outer peripheral portion of the inspection target by the light from the light irradiator based on a signal that indicates start of the inspection of the inspection target,
wherein heating the inspection target includes irradiating light from both a light source in a region including a position of the inspection target, among the plurality of regions, and a light source in a region surrounding the region including the position of the inspection target, and
wherein the heating the outer peripheral portion of the inspection target includes turning off the light source in the region including the position of the inspection target, thereby not irradiating light to the inspection target during the inspection of the inspection target.

* * * * *